(12) United States Patent
Baur et al.

(10) Patent No.: US 6,233,153 B1
(45) Date of Patent: May 15, 2001

(54) SUBASSEMBLY HAVING A HOUSING WITH AN INTEGRAL ELECTRICAL PLUG UNIT

(75) Inventors: Richard Baur, Pfaffenhofen; Peter Hora, Schrobenhausen; Guido Wetzel, Neuburg; Alfons Wöhrl, Schrobenhausen, all of (DE)

(73) Assignee: Temic Telefunken microelectronic GmbH, Heilbronn (DE)

( * ) Notice: Subject to any disclaimer, the term of this patent is extended or adjusted under 35 U.S.C. 154(b) by 0 days.

(21) Appl. No.: 08/553,093

(22) Filed: Nov. 3, 1995

(30) Foreign Application Priority Data

Nov. 8, 1994 (DE) ................................. 44 39 471

(51) Int. Cl.$^7$ ....................................... H05K 5/00
(52) U.S. Cl. .................. 361/752; 361/803; 439/76.2; 439/66; 439/825
(58) Field of Search .................. 361/724–728, 361/736–740, 741, 747, 748, 752, 753, 756, 759, 784, 796, 798–803, 816, 818, 825, 829; 174/35 R, 51; 439/66, 79, 76.1, 700, 824, 751, 82, 825, 76.2; 312/223.1; 403/331; 307/89–91; 455/90, 300; 379/433, 434, 428, 438

(56) References Cited

U.S. PATENT DOCUMENTS

| | | | |
|---|---|---|---|
| 4,175,810 | * 11/1979 | Holt et al. | 439/82 |
| 4,766,520 | * 8/1988 | Huber et al. | . |
| 4,993,956 | 2/1991 | Pickles et al. | 439/76.1 |
| 5,206,796 | * 4/1993 | Thompson et al. | 361/818 |
| 5,210,793 | * 5/1993 | Carlson et al. | 379/433 |
| 5,215,471 | * 6/1993 | Reymond et al. | 439/66 |
| 5,266,054 | 11/1993 | Duncan et al. | . |
| 5,699,233 | * 12/1997 | Zlamal | 361/759 |

FOREIGN PATENT DOCUMENTS

| | | |
|---|---|---|
| 3248715 | 7/1984 | (DE) . |
| 3715893 | 12/1988 | (DE) . |
| 3908481 | 1/1990 | (DE) . |
| 3907681 | 9/1990 | (DE) . |
| 4016532 | 11/1990 | (DE) . |
| 91 00 962 U | 5/1991 | (DE) . |
| 3833146 | 12/1991 | (DE) . |
| 91 04 432 U | 9/1992 | (DE) . |
| 4142138 | 4/1993 | (DE) . |
| 91 13 111 U | 4/1993 | (DE) . |
| 91 14 287 U | 4/1993 | (DE) . |
| 93 04 485 U | 7/1993 | (DE) . |
| 4224720 | 2/1994 | (DE) . |
| 0359606 | 3/1990 | (EP) . |
| WO 9603852A1 | 2/1996 | (EP) . |
| 06021666 | 1/1994 | (JP) . |

* cited by examiner

Primary Examiner—Jayprakash N. Gandhi
(74) Attorney, Agent, or Firm—Venable; George H. Spencer; Norman N. Kunitz

(57) ABSTRACT

A subassembly, intended for use in motor vehicles in particular, consisting of a one-piece or multi-part housing, a plug unit with connecting pins formed integrally with the housing, and a circuit board to accommodate components, wherein the circuit board is configured and arranged in such a way that the connecting pins of the plug unit are guided directly onto or into the circuit board.

13 Claims, 3 Drawing Sheets

SUBASSEMBLY HAVING A HOUSING WITH AN INTEGRAL ELECTRICAL PLUG UNIT

BACKGROUND OF THE INVENTION

The invention relates to a subassembly, intended for use in motor vehicles in particular, consisting of a one-piece or multi-part housing, a plug unit with connecting pins, and a printed circuit board incorporating strip conductors and capable of accommodating components, whereby the plug unit forms an integral part of the one-piece or multi-part housing and the circuit board is arranged in such a way that the plug unit connecting pins are guided directly onto the circuit board.

A subassembly of this type, in this case configured as an electrical switching device, is described in publication DE 32 48 715 A1. As a means of achieving a moisture-proof housing which is suitable to accommodate, e.g., ignition systems, fuel injection systems, anti-lock braking systems or transmission control systems in motor vehicles, plug connectors 18 (among other things) are integrated into the housing during the manufacturing process by being cast around with plastic (FIGS. 2, 3). In this way, the measures required to seal a separately mounted plug are eliminated.

A disadvantage of this design is that the plug terminals must be connected to the electric switching elements 16 by means of a fastening agent 17, e.g., bonding wires, which necessitates additional work stages.

SUMMARY OF THE INVENTION

The object of the invention is to provide a subassembly which does not need any fastening components between the connecting pins and the circuit board.

According to the invention, there is a circuit board provided with strip conductors to accommodate components in a one-piece or multi-part housing, with which the plug unit is integrally formed, arranged in such a way that the plug unit connecting pins are guided directly onto the circuit board.

The advantages of the invention, in particular, are that, with the integration of the plug unit into one part of the housing, additional sealing is eliminated and no additional manufacturing operations are needed to achieve an electrical connection between the connecting pins and the strip conductors on the circuit board or components arranged thereon.

Advantageous embodiments, features and developments of the invention.

According to one such feature, contact faces are arranged on the circuit board, while the connecting pins are configured as spring-loaded plug pins. Contact is made by the pressing action of the spring-loaded plug pins onto the contact faces.

According to another feature, the plug unit is provided with stiffening devices which prevent the spring-loaded plug pins from spreading or springing back when pressed against the contact faces of the circuit board.

According to a further feature, locating and assembly aids are provided on the housing and circuit board which permit machine assembly and achieve the effect of guiding the plug unit connecting pins directly onto the contact faces of the circuit board. The spring-loaded plug pins make contact by the application of pressure at that point.

According to another feature, the locating and assembly aids described above are also used as fastening agents between the housing and circuit board or multiple housing components.

According to still further feature, so-called soldering bumps are applied to the contact faces of the circuit.

According to still another, soldering eyelets are arranged on the circuit board as an alternative, into which the plug unit connecting pins are soldered.

According to a particularly advantageous development of the invention contact-making between the connecting pins of the plug unit and the soldering eyelets of the circuit board is achieved in that the connecting pins possess a somewhat larger diameter than the soldering eyelets and are tapered at the tip, so that contact is established when the connecting pins are pressed into the soldering eyelets.

According to another feature, one part of the housing is configured as a baseplate with a surrounding groove, which serves to accommodate another part of the housing configured as a lid or cover. This surrounding groove preferably exhibits a conical profile.

According to another advantageous embodiment of the subassembly an area is formed in the rim of one part of with the housing by means of a two-component injection process, the said area being composed of a different, softer material, the purpose of which is to seal the subassembly against external (environmental) influences such as moisture or dust.

Finally, according to another feature, a number of plug units can also be arranged in one or more components of the subassembly housing.

An advantage of the invention is that no rivets, screws or similar are needed to fasten the individual housing components to each other.

BRIEF DESCRIPTION OF THE DRAWINGS

A first example of an embodiment of the invention is depicted in the drawings and will be described in detail below. A second example of an embodiment will also be explained. The drawings depict the following.

DETAILED DESCRIPTION OF THE PREFERRED EMBODIMENTS

Figure 1:
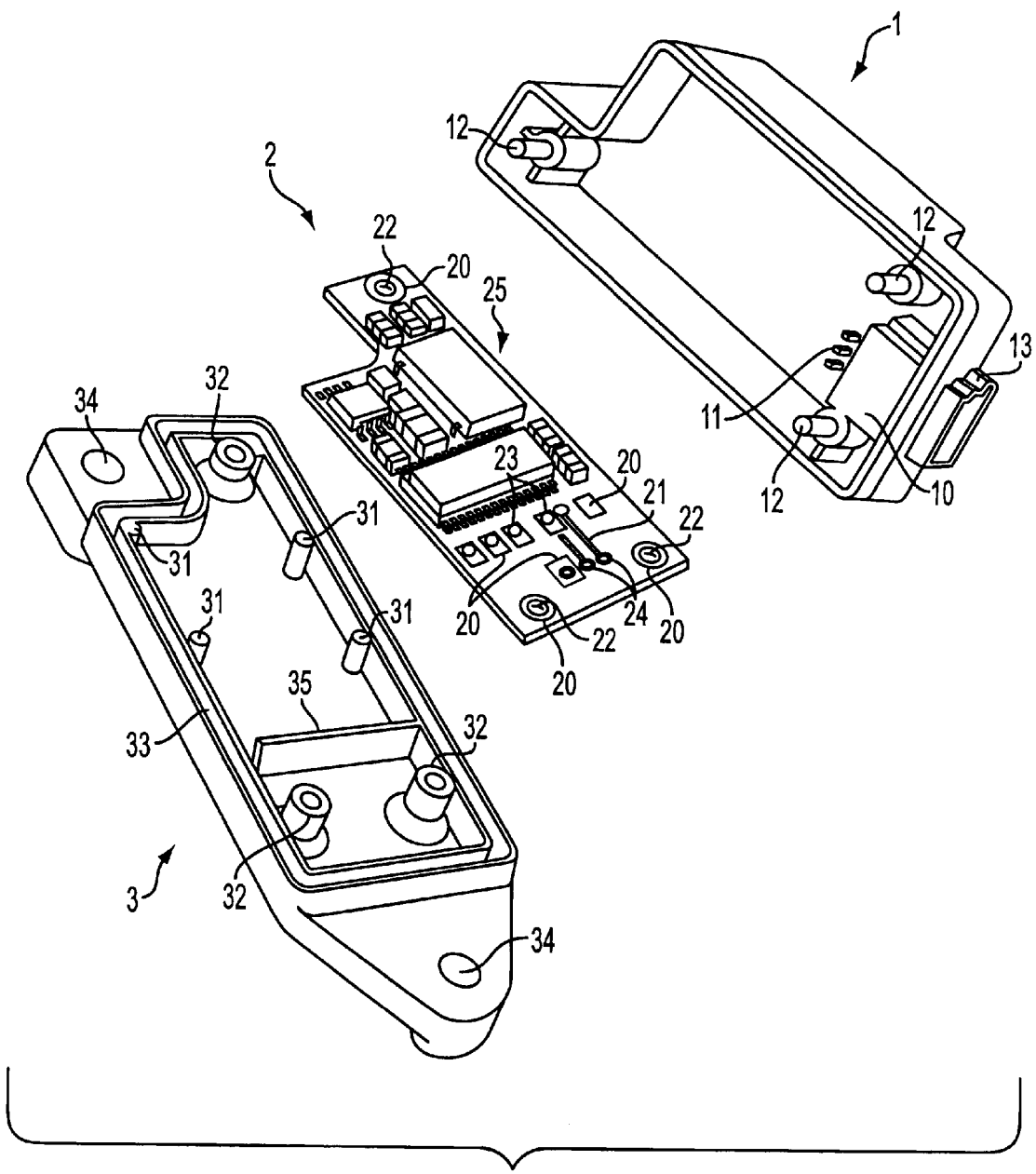
FIG. 1 is a perspective representation of a first example of an embodiment of a subassembly complying with the invention, consisting of a baseplate, circuit board and cover with integral plug unit.
Figure 2:
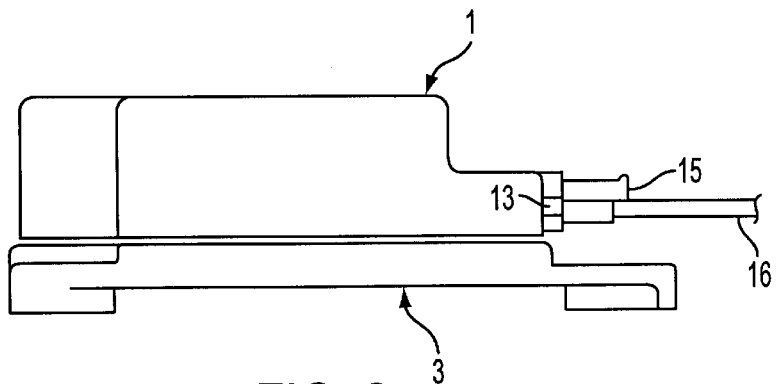
FIG. 2 is a side view of a fully assembled subassembly.
Figure 3:
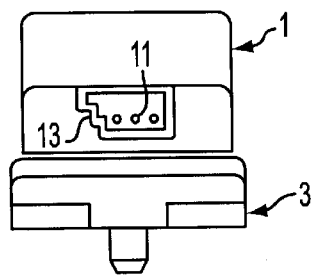
FIG. 3 is a front view of the subassembly depicted in FIG. 2.

FIGS. 1 to 4 depict a first example of an embodiment of a subassembly complying with the invention, consisting of a baseplate 3, a circuit board 2 and a cover 1, advantageously composed of a glassfibre reinforced plastic, into which a plug unit 10 is integrated which is made of the same material as the cover 1. The plug unit 10 contains connecting pins 11 made of a satisfactorily conductive, torsion resistant metal such as a copper alloy, and is provided with a polarising arrangement 13 for the purpose of ensuring that a related plug 15 with a signal lead 16 cannot be installed with the poles reversed. The locating devices 12, configured as lugs, ensure the precise alignment of the circuit board 2, so that the connecting pins 11 can be positioned accurately on the contact faces 20 or in soldering eyelets 24. In combination with the locating devices 32, configured as sockets in the baseplate 3, they ensure that the rim of the cover 1 can be fitted without difficulty into a surrounding groove 33 in the baseplate 3 during the assembly process.

Figure 4A:
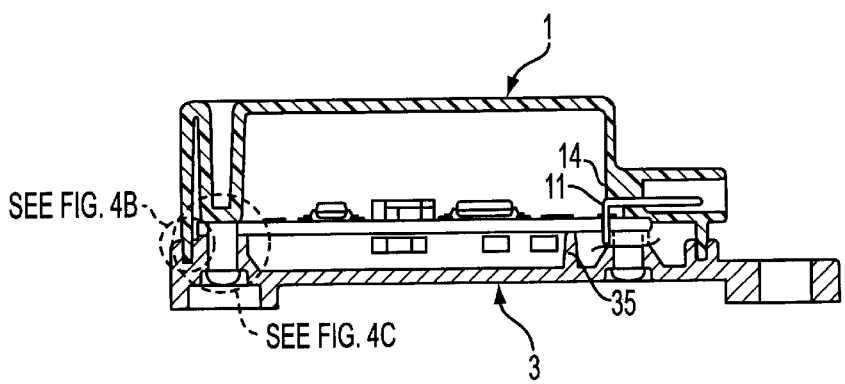
FIG. 4 is a sectional drawing of the subassembly depicted in FIG. 2.
Figure 4B:
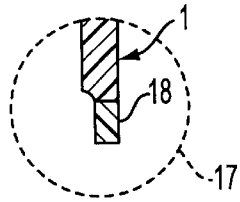
Figure 4C:
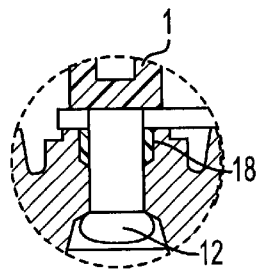

In conjunction with the sockets 32, the lugs 12 also serve to secure the housing components 1 and 3 of the subassembly on the completion of the assembly process, in that the ends of the lugs 12 projecting through the socket 32 can first be ultrasonically heated, then pressed flat. To ensure that this does not produce any excrescences on the underside of the baseplate 3, recesses are provided around the sockets 32 to accommodate the flattened lugs 12 (FIG. 4). Fastening holes 34 permit the subassembly to be secured to a designated surface by means of rivets or screws.

Contact faces 20 are arranged on the circuit board 2 for contact-making with the connecting pins 11, the said contact faces mainly being connected to electronic components 25 by means of strip conductors 21. This being so, three types of contact face 20 offer inherent advantages.

Figure 5:
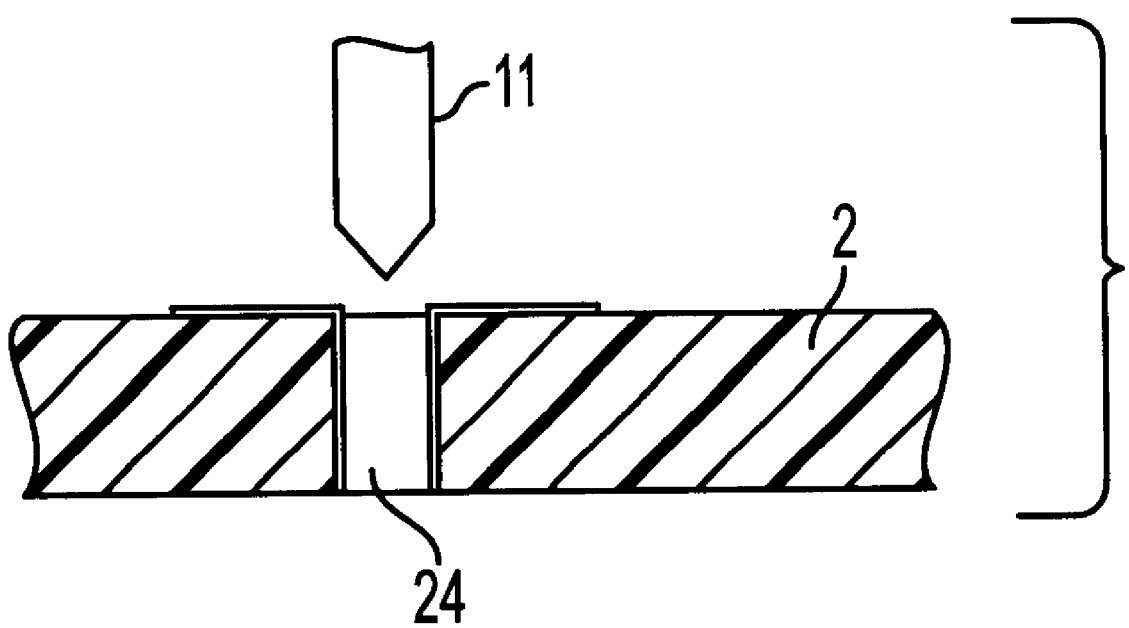
FIG. 5 is an elevation showing the relationship between the outer diameter of the pin and the inner diameter of a metallized bore for a solderless press fit connection.

In the first type, the contact faces 20 are configured as soldering eyelets 24 which are of a greater diameter than the connecting pins 11. During assembly, the connecting pins 11 are inserted through the soldering eyelets 24 in a known manner and are soldered. In the second version, so-called soldering bumps 23 are applied to the contact faces 20. For the purpose of contact-making, the connecting pins 11 are advantageously provided with tapered tips and are configured as spring-loaded plug pins; these are supported against the cover 1 by means of stiffening elements 14 (FIG. 4) and are pressed into the soldering bumps 23. In the case of the third type of contact face 20, these are again configured as soldering eyelets 24 which, in contrast to the first version, exhibit a slightly smaller diameter than the connecting pins 11 as shown in FIG. 5. It is of advantage if the tips of the connecting pins 11, again configured as spring-loaded plug pins, are tapered. For the purpose of contact-making, the circuit board 2 is pressed onto the connecting pins 11 with the aid of the locating devices 12 and 22, whereby the stiffening elements 14 (FIG. 4) prevent the connecting pins 11, configured as spring-loaded plug pins, from spreading or springing aside. When the two elements are pressed together, the circular shape of the soldering eyelets 24 is slightly notched by the hard spring-loaded plug pins 11. Spacers 31 on the baseplate 3, and the stiffening elements 14, prevent the contacts, which provide permanent contact-making with excellent conductivity, from separating after assembly. The method of establishing contact described as the third and most advantageous configuration is also designated as a "solder-free-press-fitting technique".

To provide electromagnetic shielding for the (electronic) components 25 mounted on the circuit board 2, which can also include an acceleration sensor, three measures are of advantage. In the first of these, contact faces 20 are arranged on the top and underside of the circuit board 2 at those points which come into contact with the baseplate 3 and the cover 1. As the second measure, the baseplate is made of a mechanically strong, electrically conductive metal, preferably diecast aluminum, and is provided with spacers 31 and a transverse rib 35 at those points which correspond to the contact faces 20 on the circuit board 2. As the third measure, the cover 1 is provided on the inside with either a vacuum metallized surface of a metallic lining, corresponding in shape to that of the cover 1, wherein provision must be made to ensure that the metallized surface or the lining is electrically connected to the contact faces 20 of the circuit board 2 after assembly. Together, all three measures ensure the electromagnetic compatibility of the subassembly, in that any radiated electromagnetic waves received are trapped by the metallized surface or lining, directed through the contact faces 20, the rib 35 and the spacers 31 on the baseplate 3, and discharged to ground via the screws or rivets which penetrate through the mounting holes 34.

In general, the subassembly described as the first typical embodiment is intended to be used in situations where there is a need for the sensitive components 25 on the circuit board 2 to be protected against moisture and electromagnetic radiation, e.g., when the subassembly is mounted in the engine compartment of a motor vehicle.

In a second example of an embodiment of the subassembly complying with the invention, there is a one-piece housing 1 which serves to accommodate and simultaneously to cover a circuit board 2 which is provided with switching devices 25.

By virtue of the fact that the cover is provided with fastening facilities 34, a baseplate of the type employed in the first typical embodiment is eliminated (FIG. 1); the subassembly consisting of a housing 1 and circuit board 2 can be secured, in a suitable place, directly to the interior compartment of the vehicle or a flat part of the vehicle body. The circuit board 2 can then accommodate, e.g., a hazard warning light circuit.

In general, the subassembly described as the second typical embodiment can be used in situations where it is not necessary to protect the switching components on the circuit board by a moisture-proof housing or to provide a mechanically strong baseplate.

What is claimed is:

1. A subassembly, intended for use in motor vehicles in particular, consisting of a multi-part housing, a plug unit with a plurality of individual connecting pins, and a printed circuit board incorporating strip conductors and capable of accommodating components; and wherein: the plug unit forms an integral part of the housing; the circuit board is arranged such that the plug unit connecting pins extend directly onto the circuit board; the connecting pins are provided with tapered tips; and metallized bores, connected to the strip conductors, are arranged on the circuit board, with the connecting pins each having an outer diameter somewhat larger than the diameter of the respective metallized bores, with electrical and mechanical contact-making resulting from the pressing of the connecting pins into the respective metallized bores so that an outer surface of the connecting pins with the outer diameter contacts an inner surface of the metallized bores.

2. The subassembly in accordance with claim 1, wherein the connecting pins are configured as spring-loaded plug pins on the plug unit so that contact making is further achieved by pressure applied by the spring-loaded plug pins onto the surface of the metallized bores.

3. The subassembly in accordance with claim 2, wherein stiffening elements are arranged in the plug unit in order to prevent the spring-loaded plug pins from spreading or springing back when pressed into the metallized bores.

4. The subassembly in accordance with claim 2, wherein locating devices are arranged on the housing and circuit board which act in combination such that the spring-loaded plug pins are guided directly into the metallized bores of the circuit board.

5. The subassembly in accordance with claim 4, wherein the locating devices also serve as a fastening means between the housing and the circuit board or between two or more housing components.

6. The subassembly in accordance with claim 1, wherein a surrounding groove is incorporated in a housing component configured as a baseplate to accommodate a housing component configured as a lid or cover.

7. The subassembly in accordance with claim 6, wherein the surrounding groove exhibits a conical profile.

8. The subassembly in accordance with claim 6, wherein part of the rim of one housing component and the fastening elements are composed of a different, softer material, the function of which is to seal the subassembly against external influences.

9. The subassembly in accordance with claim 1, wherein multiple plug units are arranged in the subassembly.

10. A subassembly comprising:

a housing;

a printed circuit board disposed within the housing and having a plurality of strip conductors which are disposed on at least one surface of the circuit board, and which are connected to electrical components mounted on the circuit board;

an electrical plug unit which extends through and is integral with a wall of said housing and which has a plurality of electricity connecting pins extending there through and into said housing, with said connecting pins being guided directly to and into electrical contact with respective ones of said strip conductors via respective metallized bores in the circuit board into which the respective pins extend; and wherein the connecting pins have a size and shape relative to the metallized bores so that electrical and mechanical contact-making results from the pressing of the connecting pins into the metallized bores such that an outermost peripheral surface of the pins contacts the metallization of the bores.

11. The subassembly as defined in claim 10 wherein the connecting pins have a tapered tip.

12. The subassembly as defined in claim 11 wherein the connecting pins have an outer diameter somewhat larger than the diameter of the respective metallized bores.

13. The subassembly as defined in claim 10 wherein: the housing is a two-part housing including a base portion and a cover which engages said base portion; said plug unit extends through a side wall of said cover; and said connecting pins are bent in a direction to extend into respective ones of said metallized bores on said circuit board.

* * * * *